(12) United States Patent
Bolduc

(10) Patent No.: US 6,402,012 B1
(45) Date of Patent: Jun. 11, 2002

(54) METHOD FOR FORMING SOLDER BUMPS USING A SOLDER JETTING DEVICE

(75) Inventor: Timothy David Bolduc, Westfield, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/435,843

(22) Filed: Nov. 8, 1999

(51) Int. Cl.[7] .............................................. B23K 31/02
(52) U.S. Cl. ................................. 228/180.22; 228/256
(58) Field of Search ...................... 228/180.22, 122.1, 228/123.1, 179.1, 180.1, 180.21, 256; 438/613; 257/737, 738

(56) References Cited

U.S. PATENT DOCUMENTS

| | | | | |
|---|---|---|---|---|
| 4,034,202 A | * | 7/1977 | Vandermark | 219/230 |
| 4,677,866 A | * | 7/1987 | Tone | 74/15.86 |
| 4,679,723 A | * | 7/1987 | Veit et al. | 228/168 |
| 4,733,462 A | * | 3/1988 | Kawatani | 29/840 |
| 4,811,891 A | * | 3/1989 | Yamaoka et al. | 228/182 |
| 4,950,623 A | * | 8/1990 | Dishon | |
| 5,597,110 A | * | 1/1997 | Melton et al. | 228/203 |
| 5,666,721 A | * | 9/1997 | Sakemi | 29/843 |
| 5,806,753 A | * | 9/1998 | Bielick et al. | 228/248.1 |
| 5,982,629 A | * | 11/1999 | Shoji et al. | 361/760 |
| 6,008,071 A | * | 12/1999 | Karasawa et al. | 438/115 |
| 6,015,083 A | * | 1/2000 | Hayes et al. | 228/254 |

* cited by examiner

Primary Examiner—Tom Dunn
Assistant Examiner—Jonathan Johnson
(74) Attorney, Agent, or Firm—Jimmy L. Funke

(57) ABSTRACT

A method for forming solder bumps and solder connections for surface-mount devices. The invention utilizes a solder jetting technique by which a controlled amount of solder is accurately deposited to yield solder bumps on the bond pads of a device, which upon reflow form solder connections having sufficient stand-off height to promote stress relief during thermal cycling, and achieve the necessary electrical and thermal capabilities required of the solder connections. The method generally entails solder jetting multiple solder droplets onto a surface to form a two-dimensional base pattern. An additional solder droplet may be solder jetted onto the base droplets of the two-dimensional base pattern so that the additional droplet contacts at least two of the base droplets and yields a three-dimensional structure overlying the bond pad. The solder droplets are then reflowed to form a single coalesced solder bump on the bond pad.

18 Claims, 1 Drawing Sheet

METHOD FOR FORMING SOLDER BUMPS USING A SOLDER JETTING DEVICE

TECHNICAL FIELD

The present invention generally relates to surface-mount electronic devices. More particularly, this invention relates to a method of forming solder bumps on surface-mount devices using a solder jetting device.

BACKGROUND OF THE INVENTION

Flip chips, ball grid arrays (BGAs), chip scale packages (CSPs), chip resistors and chip capacitors are examples of surface-mount devices, i.e., discrete circuit devices mounted to the surface of a substrate, such as a printed circuit board (PCB), printed wiring board (PWB), flexible circuit, or a silicon, ceramic or insulated metal substrate. These devices rely on solder connections to both secure the chip to a substrate and electrically interconnect the device to conductors formed on the substrate. The size of a flip chip is generally on the order of a few millimeters per side, while chip capacitors and resistors are typically smaller. As a result, the conductors required for surface-mount devices are narrow, e.g., line widths of about 0.5 millimeter or less, and typically spaced apart about 0.5 millimeter or less. The conductors must be formed of a solderable material, which as used herein means that a tin, lead or indium-based solder alloy is able to adhere to the conductor through the formation of a strong metallurgical bond.

Because of the small size of the solder connections, soldering a surface-mount device to its conductor pattern requires a significant degree of precision. Reflow solder techniques are widely employed for this purpose, and typically entail precisely depositing a controlled quantity of solder using methods such as printing and electrodeposition. When mounting flip chips, BGAs, CSPs and other larger surface-mount device chips, solder is typically deposited on bond pads on the chip and then heated above its liquidus temperature to yield spherically-shaped solder "bumps." After cooling to solidify the solder bumps, the chip is soldered to the conductor pattern by registering the solder bumps with their respective conductors and then reflowing the solder to form spherical-shaped solder connections. Solder bump size, chip placement and solder reflow must be precisely controlled to produce solder connections having adequate height and appropriate current-carrying and thermal management capabilities. As is well known in the art, solder connection height must often be controlled to prevent the surface tension of the molten solder bumps from drawing the chip excessively close to the substrate during the reflow operation. Sufficient spacing between a chip and its substrate, which may be termed the "stand-off height," is desirable for enabling stress relief during thermal cycles, allowing penetration of cleaning solutions for removing undesirable processing residues, and enabling the penetration of mechanical bonding and underfill materials between the chip and its substrate.

Solder connection height is controlled in part by limiting the surface area of the solderable bond pads on which the solder bumps are formed, and by controlling the amount of solder deposited on the bond pads. Solder jetting is a known technique for accurately placing solder material and controlling the volume of solder material deposited on a bond pad. Jetting techniques accurately deposit molten droplets of solder on a wettable surface. Current jetting techniques are limited to relatively low-volume solder droplets, generally diameters of about 105 Fm or less. The coordinates of each bond pad are established, and then one or more solder droplets are jetted onto each bond pad to achieve the desired solder bump volume. After jetting, the bond pad is fluxed and the solder droplets reflowed to form a single coalesced solder bump on each bond pad.

A limitation of solder jetting methods is the size of the solder bumps that can be reliably produced. The size of solder droplets produced by current jetting apparatuses is generally insufficient for larger chips such as BGAs, CSPs and many flip chips in terms of stand-off height, current capacity and thermal management issues. Accordingly, it would be desirable if a method were available for producing relatively large solder bumps whose volume and subsequent solder connection height are controlled by a solder jetting technique.

SUMMARY OF THE INVENTION

The present invention provides a method for forming solder bumps and solder connections for surface-mount devices. The invention utilizes a solder jetting technique by which a controlled amount of solder is accurately deposited to yield solder bumps on the bond pads of a device, which upon reflow form solder connections having sufficient stand-off height to promote stress relief during thermal cycling, and achieve the necessary electrical and thermal capabilities required of the solder connections.

The method of this invention generally entails solder jetting multiple solder droplets onto a surface to form a two-dimensional base pattern on a bond pad of a surface-mount device. An additional solder droplet is then solder jetted onto the "base" droplets of the two-dimensional base pattern so that the additional droplet contacts at least two of the base droplets and yields a three-dimensional structure overlying the bond pad. All of the solder droplets are then reflowed to form a single coalesced solder bump on the bond pad. To maximize solder volume for a given bond pad, the base droplets are preferably located at or sufficiently near the perimeter of the bond pad so that surface tension will cause the molten solder to coalesce on the bond pad during reflow. The additional droplet is deposited to contact at least two and preferably all of the base droplets, which may be spaced so that the additional droplet is supported above the bond pad, or jetted down among the base droplets so as to contact the bond pad.

In view of the above, the present invention enables the use of a solder jetting technique to produce a three-dimensional structure of solder droplets, which can then be reflowed to form a relatively large solder bump on a bond pad. Three-dimensional structures produced by the method of this invention are stable, which allows the device to be handled prior to reflow. More particularly, the solder droplets used to form the two-dimensional base pattern define a pocket in which the additional droplet is securely received. With this invention, an appropriate volume of solder can be deposited to produce solder bumps that will form a solder connection having an adequate height to allow an underfill material to flow beneath the device, promote stress relief during thermal cycling, and achieve the necessary electrical and thermal capabilities required of the solder connections.

Other objects and advantages of this invention will be better appreciated from the following detailed description.

DESCRIPTION OF THE PREFERRED EMBODIMENT

The present invention employs a solder jetting technique by which molten droplets of solder are propelled at a wettable surface, such as a bond pad of a surface-mount device. Solder jetting techniques are well known in the art, and therefore will not be discussed in any great detail here. Solder jetting as employed by this invention generally entails the use of known tin-based, lead-based or indium-based solder alloys that can be reflowed at sufficiently low temperatures to avoid thermal damage to a surface-mount device and its circuit components.

Figure 1:
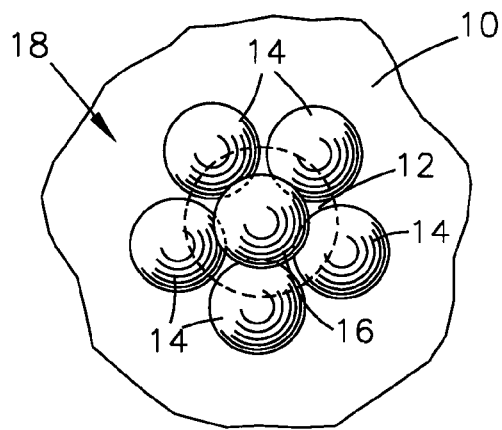
FIGS. 1 and 2 are plan views of three-dimensional structures formed by solder jetting droplets of solder onto a bond pad of a surface-mount device in accordance with two embodiments of the present invention.
Figure 2:
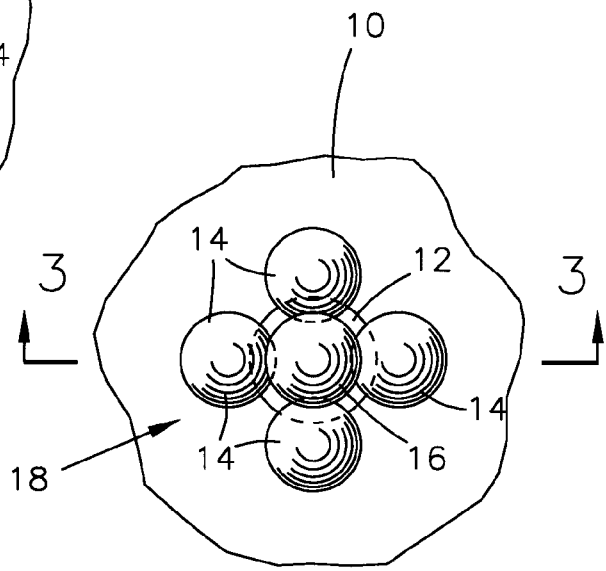

FIGS. 1 and 2 depict the surface of a surface-mount device 10 on which a bond pad 12 has been formed by conventional methods. The invention is applicable to essentially any surface-mount component, including flip chips, BGAs and CSPs. The surface surrounding the pad 12 is typically formed by a thin layer of a passivation material that serves to protect the underlying surface of the device from environmental contaminants, moisture and electrical shorts. The passivation material is typically an oxide such as silicon dioxide, though silicon nitride, polyimide, phosphosilicated glass (PSG), borophosphosilicated glass (BPSG), alumina and Dow Chemical's CYCLOTENE are also used. These materials are nonsolderable, in that a tin, lead and/or indium-base solder will not metallurgically bond to them. In contrast, at least the exposed surface of the bond pad 12 is formed of a solderable material, i.e., to which tin, lead and/or indium-base solders will metallurgically bond and reliably adhere. The bond pad 12 can be formed of various materials known in the art, including underbump metallurgy (UBM) structures formed by multiple layers of different metals, such as layers chromium, nickel, vanadiumn, copper and/or titanium.

Figure 3:
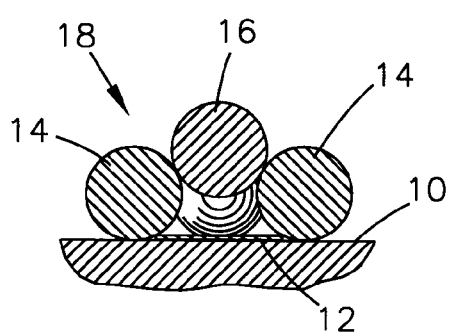
FIG. 3 is a cross-sectional view of the three-dimensional structure of FIG. 2.

In each of FIGS. 1 and 2, solder droplets 14 are shown as being deposited by solder jetting around the perimeter of the pad 12 to define a two-dimensional base structure (i.e., all of the droplets 14 lie in a single plane). An additional solder droplet 16 is shown as having been solder jetted onto the base droplets 14 to create a three-dimensional structure 18 (i.e., the additional droplet 16 lies outside of the plane defined by the base droplets 14). In FIG. 1, five base droplets 14 are shown around the perimeter of the bond pad 12, and a sixth solder droplet 16 is shown as having been solder jetted onto the five base droplets 14, within a central recess or pocket defined by the base droplets 14. In FIG. 2, four base droplets 14 are shown surrounding the perimeter of the bond pad 12, with a fifth droplet 16 jetted onto the four base droplets 14, again within a pocket defined by the base droplets 14. In each embodiment, the last droplet 16 may be suspended above the surface of the bond pad 12 by the base droplets 14 deposited, as depicted in FIG. 3. Alternatively, and as shown in phantom in FIG. 3, the last droplet 16 may contact the bond pad 12 as a result of the manner in which the droplet 16 was deposited and the positions of the base droplets 14. Contact between the last droplet 16 and pad 12 is in part the result of the droplet 16 becoming deformed upon impact with the base droplets 14, causing a portion of the droplet 16 to "extrude" down through the base droplets 14 during jetting.

Figure 4:
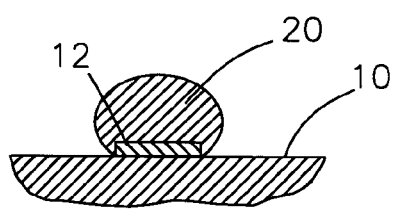
FIG. 4 is a cross-sectional view of a solder bump formed by reflowing the structure of FIG. 3.

The three-dimensional structures 18 shown in FIGS. 1, 2 and 3 exist immediately after the jetting operation and prior to a solder reflow operation, during which the solder droplets 14 and 16 melt, coalesce on the pad 12 and then, upon resolidifying, metallurgically bonds to the pad 12, producing a single semispherical solder bump 20 such as that shown in FIG. 4. Using a commercially available jetting apparatus, the droplets 14 and 16 are deposited by inserting the desired x,y coordinates for the locations of each of the droplets 14 and 16, then jetting the base droplets 14 on or around the pad 12 to create the pocket into which the final droplet 16 is jetted. While the base droplets 14 are shown in FIGS. 1 and 2 as being positioned equidistantly around the perimeter of the pad 12 (equiangularly around the center of the pad 12), such placement is not required to achieve the objects of this invention. According to the preferred embodiment of this invention, the base droplets 14 are arranged in a two-dimensional pattern that will provide ample and stable support for the final droplet 16, which adheres to at least two of the base droplets 14, but more preferably all of the base droplets 14.

The solder droplets 14 and 16 are shown in FIGS. 1, 2 and 3 as having smaller diameters than the width of the bond pad 12. As an example, droplets with diameters of about 4 mils (about 100 Fm) can be jetted onto a bond pad with a diameter of about 6 mils (about 150 Fm). Solder droplets with significantly smaller diameters. e.g., about 2 mils (about 50 Fm), are also within the scope of this invention. Pads 12 that are relatively larger than the solder droplets 14 and 16 allow for the deposition of more droplets 14 and 16, and can potentially avoid the need for a three-dimensional structure or otherwise reduce the height of a three-dimensional structure required to provide the desired solder volume. Alternatively, the diameters of the droplets 14 and 16 can be about the same as or even larger than that of the bond pad 12. For example, droplets 14 and 16 with diameters of about 105 Fm could be jetted onto a bond pad 12 with a diameter of about 100 Fm.

As noted above, the base droplets 14 are located around the perimeter of the pad 12, each preferably contacting the bond pad 12 without being directly jetted onto the surface of the pad 12. As a result of the jetting operation, the base droplets 14 adhere to the nonsolderable surface of the device 10 surrounding the pad 12, but will not metallurgically bond to the nonsolderable surface after jetting or reflow. As depicted in FIGS. 1, 2 and 3, the droplets 14 are shown as being sized and placed so that a greater volume of each droplet 14 lies outside the perimeter of the pad 12, with a portion of each droplet 14 projecting over the perimeter of the pad 12.

Figure 5:
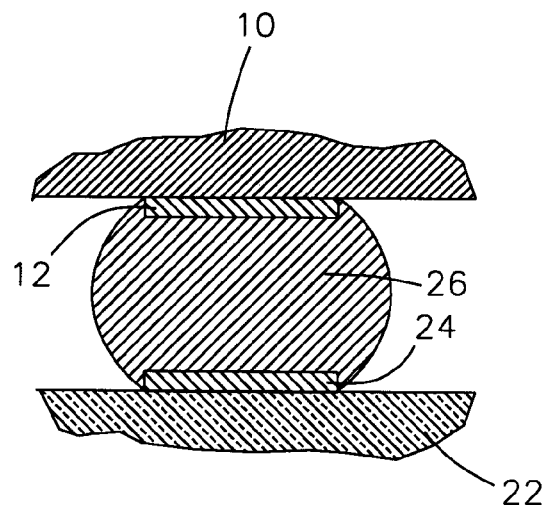
FIG. 5 is a cross-sectional view of a solder connection formed by registering the solder bump of FIG. 4 with a conductor on a substrate and then reflowing the solder bump.

As shown in FIG. 4, the droplets 14 and 16 coalesce during reflow to produce a single solder bump 20. As known in the art, suitable reflow temperatures and durations depend on the particular solder alloy used. As also known in the art, the device 10 is preferably fluxed prior to reflow to displace any oxides on the surfaces of the pad 12 and droplets 14 and 16, thereby promoting solderability. In FIG. 5, the device 10 is shown as being mounted to a substrate 22 having a conductor 24 with which the solder bump 20 is registered and then reflowed to form a columnar solder connection 26. The conductor 24 may be formed by known printing or etching techniques, and may be formed of any suitable solderable material, such as copper, silver, palladium or a silver-palladium alloy. The substrate 22 may be a printed circuit board (PCB), printed wiring board (PWB), flexible circuit, or a silicon, ceramic or insulated metal substrate, as is known in the art. During reflow, the molten solder bump 20 coalesces between the solderable bond pad 12 and conductor 24, but is inhibited from flowing onto the nonsolderable surfaces of the device 10 and substrate 22 surrounding the pad 12 and conductor 24, respectively. As the molten solder alloy coalesces during reflow, surface tension constrains the final shape of the solder connection 26 in accordance with the surface area of the pad 12, such that a relatively small pad 12 promotes the height of the solder connection 26. As seen from FIGS. 3,4 and 5, the size of the bond pad 12 does not critically limit the volume of solder provided by the three-dimensional solder droplet structures 18 of this invention, such that sufficient solder is available to yield an acceptable stand-off height for the device 10 relative to the substrate 22.

In several investigations leading to this invention, various three-dimensional solder droplet structures were formed, each by jetting three solder droplets to form two-dimensional base structures onto which a single final droplet was jetted. The jetting apparatus used was manufactured by the MPM Corporation, and designated "DS1." The droplets were formed of the eutectic tin-lead solder alloy, and had diameters of about 102 Fm. The droplets of the two-dimensional base structure were deposited around bond pads having diameters of about 152 Fm. Jetting was performed by inserting the desired x,y coordinates for each of the droplets, then jetting the three base droplets followed by the final upper droplet. The final droplet was jetted into the pocket formed by the three base droplets, and was suspended out of contact with the pad. During reflow at a temperature of about 183EC, the droplets melted and coalesced to form a single solder bump on each bond pad, generally as depicted in FIG. 4.

While the invention has been described in terms of particular embodiments, it is apparent that other forms could be adopted by one skilled in the art. Accordingly, the scope of the invention is to be limited only by the following claims.

What is claimed is:

1. A method of forming a solder bump using a solder jetting device, the method comprising the steps of:

providing a bond pad having a perimeter;

solder jetting multiple solder droplets to form a two-dimensional base pattern with each of the multiple solder droplets being located at the perimeter of the bond pad and contacting the bond pad, each of the multiple solder droplets having a diameter that is greater than a minimum width of the bond pad and at least one of the multiple solder droplets contacting a nonsolderable surface adjacent the bond pad; and then reflowing the multiple solder droplets to form a single coalesced solder bump on the bond pad.

2. A method as recited in claim 1, wherein each of the multiple solder droplets projects over the perimeter of the bond pad prior to the reflow step.

3. A method as recited in claim 1, wherein more than half by volume of each of the multiple solder droplets is outside the perimeter of the bond pad prior to the reflow step.

4. A method as recited in claim 1, wherein the two-dimensional base pattern is formed by four solder droplets spaced substantially equidistantly along the perimeter of the bond pad.

5. A method as recited in claim 1, wherein the two-dimensional base pattern is formed by five solder droplets spaced substantially equidistantly along the perimeter of the bond pad.

6. A method of forming a solder bump using a solder jetting device, the method comprising the steps of:

providing a bond pad having a perimeter;

solder jetting multiple solder droplets to form a two-dimensional base pattern with each of the multiple solder droplets contacting the bond pad;

solder jetting an additional solder droplet onto the multiple solder droplets of the two-dimensional base pattern, the additional solder droplet contacting at least two of the multiple solder droplets, the multiple solder droplets and the additional solder droplet defining a three-dimensional structure overlying the bond pad; and then reflowing the multiple solder droplets and the additional solder droplet to form a single coalesced solder bump on the bond pad.

7. A method as recited in claim 6, wherein the additional solder droplet has a diameter that is less than a minimum width of the bond pad.

8. A method as recited in claim 6, wherein the additional solder droplet contacts each of the multiple solder droplets prior to the reflow step.

9. A method as recited in claim 6, wherein the additional solder droplet is supported above the bond pad by the multiple solder droplets prior to the reflow step.

10. A method as recited in claim 6, wherein the additional solder droplet contacts the bond pad prior to the reflow step.

11. A method as recited in claim 6, wherein the two-dimensional base pattern is formed by four solder droplets, and the additional solder droplet contacts and is supported above the bond pad by each of the four solder droplets prior to the reflow step.

12. A method as recited in claim 6, wherein the two-dimensional base pattern is formed by tour solder droplets, and the additional solder droplet contacts the bond pad and each of the four solder droplets prior to the reflow step.

13. A method as recited in claim 6, wherein the two-dimensional base pattern is formed by five solder droplets, and the additional solder droplet contacts and is supported above the bond pad by each of the five solder droplets prior to the reflow step.

14. A method as recited in claim 6, wherein the two-dimensional base pattern is formed by five solder droplets, and the additional solder droplet contacts the bond pad and each of the five solder droplets prior to the reflow step.

15. A method of forming a solder bump on a surface-mount device using a solder jetting device, the method comprising the steps of:

providing a surface-mount device with a bond pad having a perimeter;

solder jetting at least three solder droplets onto the surface mount device around the perimeter of the bond pad to form a two-dimensional base pattern, each of the at least three solder droplets contacting the bond pad and projecting over the perimeter of the bond pad, each of the at least three solder droplets having a diameter that is less than a minimum width of the bond pad;

solder jetting a single additional solder droplet onto the two-dimensional base pattern so that the additional solder droplet contacts each of the at least three solder droplets and yields a three-dimensional structure overlying the bond pad, the additional solder droplet having a diameter that is less than the minimum width of the bond pad;

reflowing the at least three solder droplets and the additional solder droplet to form a single coalesced solder bump on and adhered to the bond pad;

registering the surface-mount device with a conductor pattern so that the solder bumps are individually registered with conductors on a substrate; and then reflowing, the solder bumps to form solder connections that electrically and physically connect the bond pads to the conductors.

16. A method as recited in claim 15, wherein more than half by volume of each of the at least three solder droplets is outside the perimeter of the bond pad prior to the reflow step.

17. A method as recited in claim 15, wherein the additional solder droplet is supported above the bond pad by the at least three solder droplets prior to the reflow step.

18. A method as recited in claim 15, wherein the additional solder droplet contacts the bond pad prior to the reflow step.

* * * * *